United States Patent
Ito et al.

(10) Patent No.: US 8,731,412 B2
(45) Date of Patent: May 20, 2014

(54) COMMON BASE CIRCUIT WITH OUTPUT COMPENSATION, CURRENT-TO-VOLTAGE CIRCUIT CONFIGURED WITH COMMON BASE AMPLIFIER, AND OPTICAL RECEIVER IMPLEMENTED WITH THE SAME

(75) Inventors: Makoto Ito, Yokohama (JP); Taizo Tatsumi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 329 days.

(21) Appl. No.: 13/296,594

(22) Filed: Nov. 15, 2011

(65) Prior Publication Data

US 2012/0121273 A1    May 17, 2012

(30) Foreign Application Priority Data

Nov. 17, 2010 (JP) .................................. 2010-257076

(51) Int. Cl.
*H04B 10/06* (2006.01)
*H03F 3/38* (2006.01)

(52) U.S. Cl.
USPC ........... 398/208; 398/202; 398/209; 398/210; 330/278; 330/291; 330/75; 330/127

(58) Field of Classification Search
USPC .................................................. 398/202–214
See application file for complete search history.

(56) References Cited

U.S. PATENT DOCUMENTS

| 4,529,947 A * | 7/1985 | Biard et al. ................... 330/259 |
| 7,821,335 B2 * | 10/2010 | Shiramizu et al. .............. 330/98 |
| 2004/0047376 A1 * | 3/2004 | Shapiro et al. ............. 372/38.02 |
| 2008/0284522 A1 * | 11/2008 | Denoyer ....................... 330/308 |

FOREIGN PATENT DOCUMENTS

| JP | 02-100406 | * | 4/1990 | ............... H03G 3/02 |
| JP | H02-100406 A | | 4/1990 | |
| JP | H09-008534 | | 1/1997 | |
| JP | H11-205047 | | 7/1999 | |
| JP | 2009-246823 | | 10/2009 | |

* cited by examiner

*Primary Examiner* — Li Liu
(74) *Attorney, Agent, or Firm* — Global IP Counselors, LLP

(57) ABSTRACT

An amplifier implementing with a common base circuit is disclosed. The amplifier includes the common base circuit, a current shunt, and a current supplement. The common base circuit receives an input current. The current shunt shunts the input current based on the average of the output of the pre-amplifier. The current supplement supplements a current shunted by the current shunt.

12 Claims, 10 Drawing Sheets time (100ps/div.)

COMMON BASE CIRCUIT WITH OUTPUT COMPENSATION, CURRENT-TO-VOLTAGE CIRCUIT CONFIGURED WITH COMMON BASE AMPLIFIER, AND OPTICAL RECEIVER IMPLEMENTED WITH THE SAME

BACKGROUND OF THE INVENTION

1. Field of the Invention

The present invention relates to a common base circuit with output compensation, a current-to-voltage circuit configured with the common base circuit, and an optical receiver implementing with the current-to-voltage converter.

2. Related Prior Art

A Japanese Patent Application published as JP-H09-008534A has disclosed an amplifier with the common base arrangement. FIG. 8 shows a fundamental portion of the common base circuit disclosed therein. The amplifier 100 includes three (3) transistors, 101 to 103. The transistor 103 has the common base configuration where the emitter thereof receives the photocurrent generated in a photodiode by illuminated with an optical signal; the base thereof is fixedly biased; and the collector generates an output. The other two transistors, 101 and 102, have an arrangement of, what is called, the tandem connection, namely, the collector of the transistor 101 is directly connected to the base of the other transistor 102, while, the base of the transistor 101 is connected to the emitter of the other transistor 102. These two transistors, 101 and 102, connected in tandem operate as a load of the last transistor 103.

Another Japanese Patent Application published as JP-H11-205047A has disclosed, what is called, a trans-impedance amplifier (hereafter denoted as TIA) used in an optical receiver that converts a photocurrent into a voltage signal. The TIA disclosed therein includes a transistor with the common base arrangement, a variable current source coupled with the emitter of the transistor, a load resistor, a fixed bias source for the base of the transistor, and a controller connected between the input and the output of the TIA to adjust the magnitude of the current generated in the current source depending on the output voltage.

Still another Japanese Patent Application published as JP-2009-246823A has disclosed a type of TIA. The TIA disclosed therein has a plurality of power supplies dynamically switched depending on the magnitude of the input photocurrent.

An optical receiver generally includes a photodiode (hereafter denoted as PD), and a pre-amplifier to convert the photocurrent into a voltage signal and amplifies this voltage signal. A TIA is generally applicable to such a pre-amplifier. A TIA has an arrangement including an inverting amplifier with high input impedance and a trans-impedance element, typically a resistor, connected between the input and the output of the inverting amplifier. In such an arrangement, a substantial portion of a current input to the TIA flows in the trans-impedance to cause a voltage drop thereat. Thus, the voltage drop, which may be evaluated by a product of the input current with the impedance of the trans-impedance element, becomes proportional to the input current.

The TIA with the arrangement above described is necessary to set the input impedance of the inverting amplifier high enough, which equivalently enhance the input capacitance of the amplifier and resultantly degrades the high frequency performance of the pre-amplifier.

Another type of the pre-amplifier of an optical receiver has been known as the common base circuit. The common base circuit receives the photocurrent generating in the PD at the emitter of the transistor, and outputs a voltage signal form the collector. The common base circuit has an inherent feature of the low input impedance, which may eliminate the influence of the input capacitance of the device. Moreover, the output of the common base circuit, which is drawn from the collector, has a phase same with that of the input; accordingly, the common base circuit may reduce the miller effect between the output and the input.

However, the common base circuit has a subject explained in FIG. 9 that shows a fundamental circuit of a conventional common base circuit. The common base circuit 200 includes a transistor 201 whose base is fixedly biased by a voltage Va determined by a ratio of resistance of two resistors, 202a and 202b; the collector thereof is connected to the power supply Vcc through a load resistor 205; and the emitter is grounded through the constant current source 206. The input current Iin is given to the emitter of the transistor 201, while, the output Vout thereof is given at the collector.

When no input current Iin is input, the current flowing in the transistor 201 and the resistor 205 is given by $I_E$, substantially equal to the constant current determined by the current source 206. When a substantial current Iin is input, which flows into the current source 206, the current flowing in the load resistor 205 becomes $I_E$–Iin. Thus, as the input current increases, which decreases the current flowing in the load resistor 205, the voltage drop by the load resistor 205 becomes smaller and the output level Vout approaches the power supply Vcc and saturates thereto.

FIG. 10 shows eye diagrams of the output Vout of the common base circuit 200 as varying the input current Iin from 100 µA to 2000 µA. As shown in FIG. 10, the cross point of the eye diagrams shifts to the higher level as the input current Iin increases. This is because the output Vout rises faster and saturates as the input current Iin increases. Thus, the conventional common base circuit 200 has an inherent subject that the output Vout degrades the shape thereof as the input current Iin increases.

SUMMARY OF THE INVENTION

One aspect of the present invention relates to an amplifier circuit that includes a common base circuit, a current shunt, and a current supplement. The common base circuit includes the first transistor that operates in the common base arrangement. The first transistor may receive an input current in the emitter thereof and generates the first current flowing therein. The current shunt may shunt the second current from the first current depending on the average of the output of the amplifier. The current supplement may supply the third current to the first current. The third current is equal to the second current that is shunt from the first current by the current shunt.

In the amplifier according to the present invention, the reduction of the first current flowing in the common base transistor due to the shunting by the current shunt may be supplied by the third current generated in the current supplement. Accordingly, the signal deformation inherently appeared in the output of the conventional common base amplifier may be effectively suppressed to be independent of the input current.

Another aspect of the present invention relates to a current-to-voltage converter with the common base arrangement. The current-to-voltage converted includes an amplifier with the common base arrangement above described and a detector to detect the output of the current-to-voltage converter. Even in the current-to-voltage converter, the decrease of the current flowing in the common base transistor due to the current shunt depending on the input current may be compensated by the current supplement. Accordingly, the distortion of the output signal, in particular, the shift of the cross point in the eye diagram of the output, may be effectively suppressed.

Still another aspect of the present invention relates to an optical receiver that implements the PD, the current-to-voltage converter with the common base arrangement to convert the photocurrent generated in the PD into a voltage signal, a series of differential amplifiers, and an offset adjustor. Because the current-to-converter has an arrangement same as those described above, the distortion appeared in the output of the current-to-voltage converter when the optical input is strengthened and the photocurrent becomes large may be effectively suppressed. Moreover, the common base arrangement of the input of the current-to-voltage converter inherently has characteristics of the restricted input impedance and the phase of the output signal common to that of the input signal; accordingly, the current-to-voltage converter is hard to be affected by the input capacitance and the miller effect, which may suppress degradations in the high frequency performance of the optical receiver.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS

Next, some preferred embodiments of an amplifier, a current-to-voltage converted, and an optical receiver according to the present invention will be described as referring to accompanying drawings. In the description of the drawings, elements same with or similar to those will be referred by the numerals same with or similar to each other without overlapping explanations.

Figure 1:
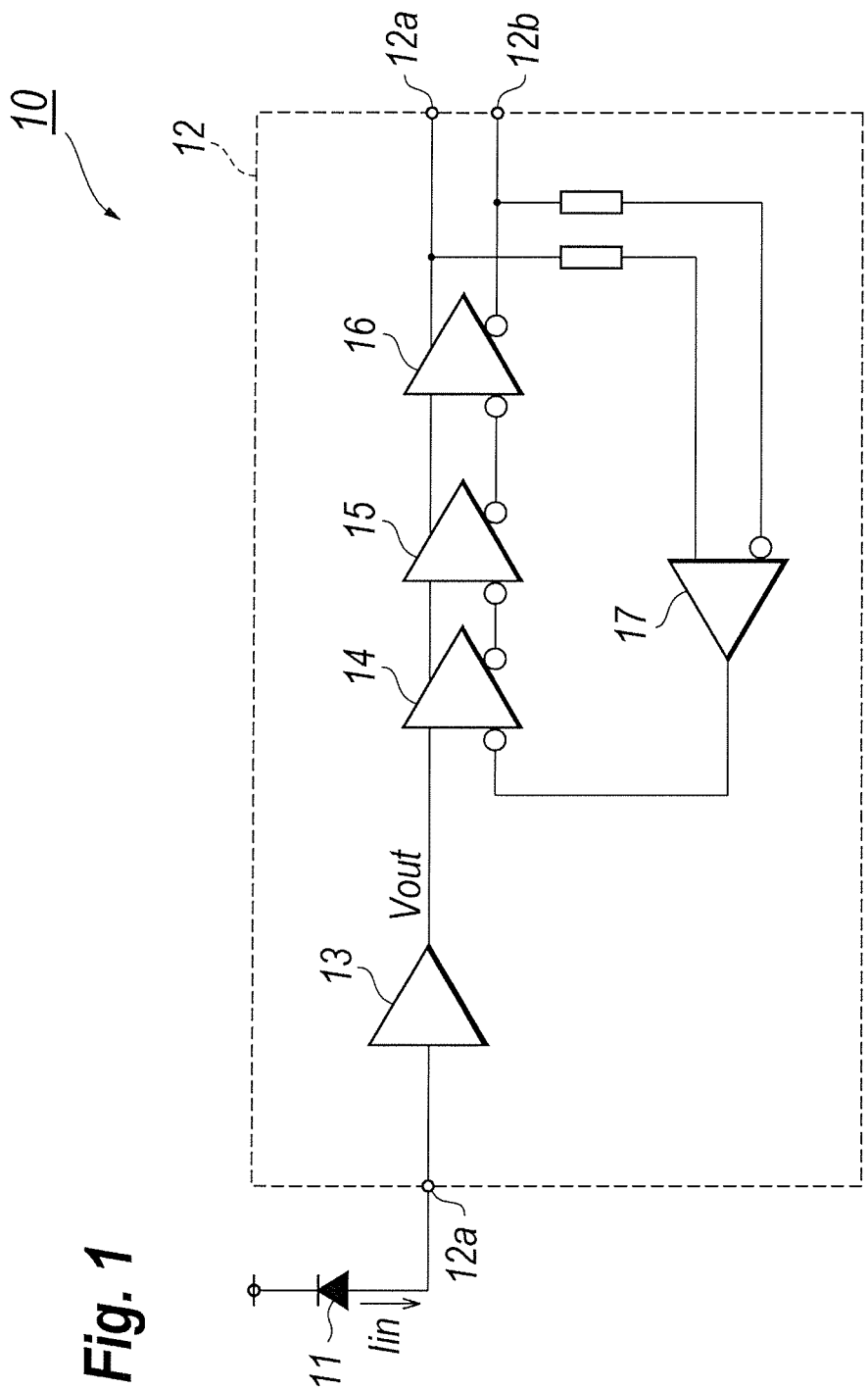
FIG. 1 is a functional block diagram of an optical receiver according to an embodiment of the present invention.

FIG. 1 is a functional block diagram of an optical receiver 10 according to an embodiment of the present invention. The optical receive 10 may convert a photocurrent Iin generated by a PD 11 into a faint voltage signal and amplify this voltage signal to a substantial level. The optical receiver 10, as shown in FIG. 1, includes the PD 11 and an optical receiving circuit 12 that comprises a pre-amplifier 13, three (3) differential amplifiers, 14 to 16, and an offset compensator 17.

The PD 11 may generate the photocurrent Iin by receiving an optical signal with high frequency components to the optical receiving circuit 12. The photocurrent Iin corresponds to the optical signal. The photocurrent Iin is provided to the pre-amplifier 13 through an input terminal 12a of the optical receiving circuit 12. The pre-amplifier 13 may not only amplify the signal but also convert the photocurrent Iin into the faint voltage signal Vout. This voltage signal Vout is transferred to the differential amplifier 14, and so on. The signals, which are complementary to each other and output from the last differential amplifier 16, are externally output from the output terminals, 12a and 12b, of the optical receiving circuit 12. The offset compensator 17 may adjust the output offset of the first differential amplifier 14 by receiving the outputs from the last differential amplifier 16 and adjusting the input of the first differential amplifier 14.

Figure 2:
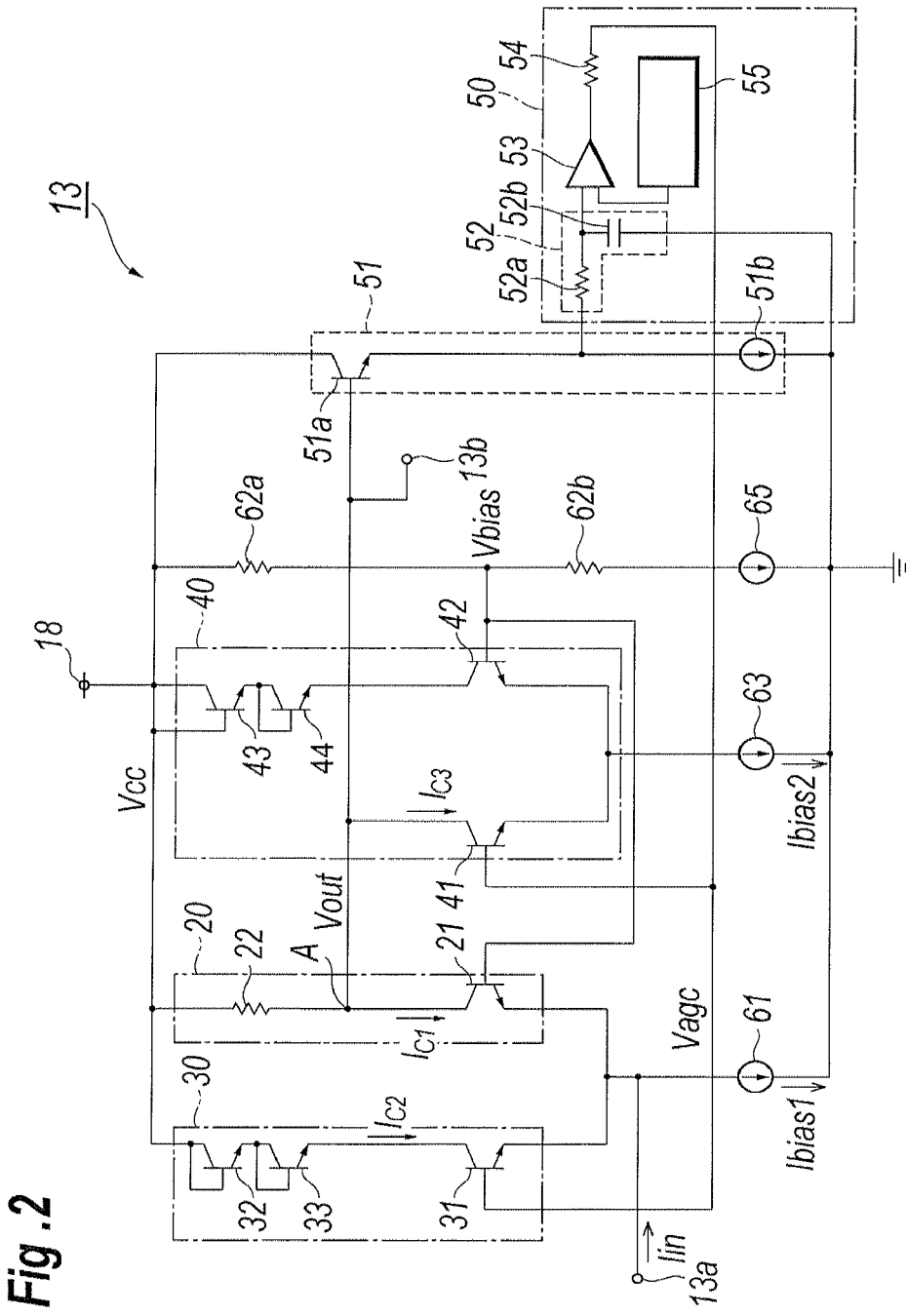
FIG. 2 is a circuit diagram of the pre-amplifier according to an embodiment of the present invention.
Figure 3:
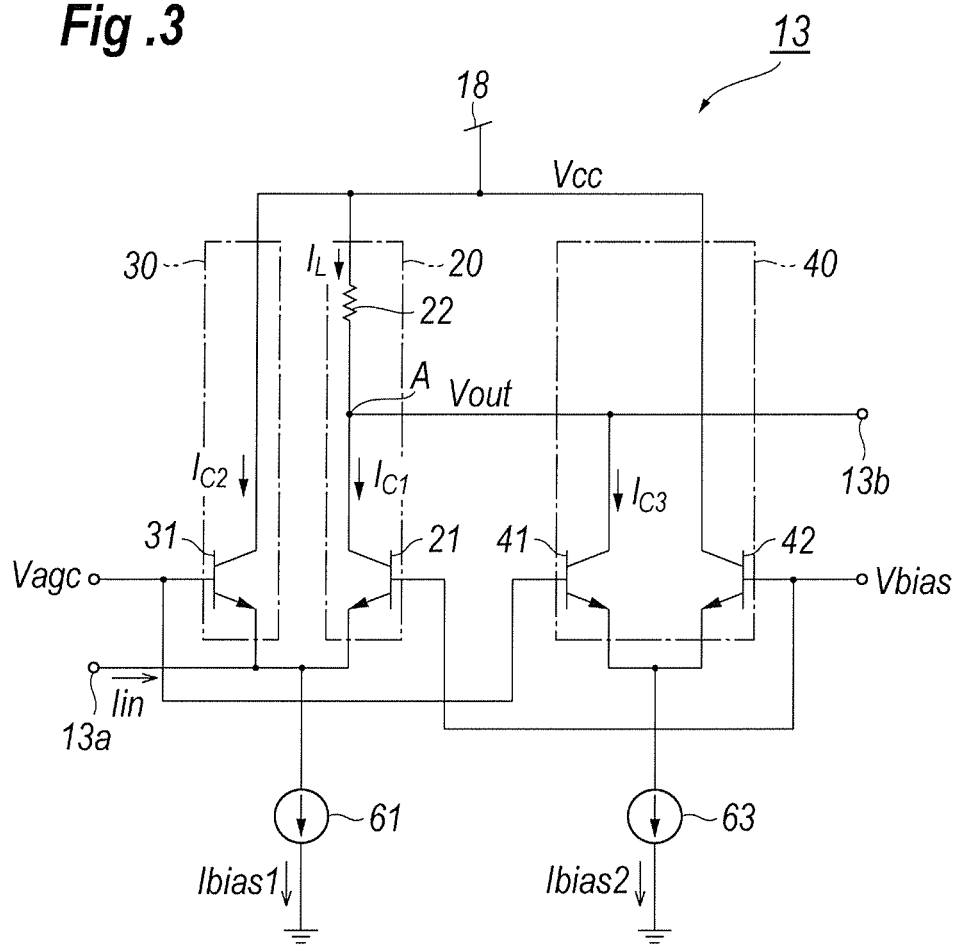
FIG. 3 only displays a fundamental part of the common base circuit, the current shunt, and the current supplement.

FIG. 2 is a circuit diagram of the pre-amplifier 13 according to an embodiment of the present invention. The pre-amplifier 13 includes a common base circuit 20, a current shunt 30, a current supplement 40, a detector 50, and an emitter follower 51. FIG. 3 only displays a fundamental part of the common base circuit 20, the current shunt 30, and the current supplement 40 for explanation sake.

The common base circuit 20 includes a transistor 21, which is the first transistor of the current embodiment, and a load resistor 22. The transistor 21 has the common base configuration, that is, a signal Iin to be amplified is given in the emitter thereof and output from the collector thereof as the base is fixedly biased by a reference Vbias. The emitter of the transistor 21 is grounded through the current source 61, while, the collector in the node A is biased by the power supply Vcc (18) through the load resistor 22, and the base thereof receives the reference Vbias determined by two (2) resistors, 62a and 62b, and a current source 65 where they are connected in series between the power supply Vcc (18) and the ground.

The output Vout of the common base circuit 20 is drawn from the node A, the collector of the transistor 21. Specifically, the node A is connected to the output terminal 13b of the pre-amplifier 13.

The current shunt 30 includes a transistor 31, which is the second transistor of the present embodiment and connected in parallel to the common base circuit 20. Specifically, the emitter of the transistor 31, which is connected to the emitter of the first transistor 21, is grounded through the current source 61. The emitter of this transistor 31 may also receive the input current Iin from the input terminal 13a. The collector of the transistor 31 is biased from the power supply Vcc (18) through two transistors, 32 and 33, connected in series and having the diode connection. The base of the transistor 31 receives a gain control signal Vagc output from the detector 50.

The current supplement 40 includes two transistors, 41 and 42. The former transistor 41, which is the third transistor of the present embodiment, connected in the collector thereof to the node A. The latter transistor 42, which is the fourth transistor of the present embodiment, is connected in parallel to the third transistor 41 and the load resistor 22. Specifically, the collector of the fourth transistor 41 is the node A and has the load resistor 22 common to the first transistor 21. The emitter of the transistor 41 is grounded through the current source 63. The base of the transistor 41 receives the gain control signal Vagc from the detector 50.

On the other hand, the collector of the fourth transistor 42 is biased by the power supply Vcc (18) through two transistors, 43 and 44, each connected in series to the others and having the diode connection. The emitter of the transistor 42 grounded through the current source 63 common to the emitter of the third transistor 41. The base of the fourth transistor 42 receives the fixed bias Vbias.

The current source 63 is the second current source of the present embodiment and may generate a constant current Ibias2 substantial equal to the constant current Ibias1 generated by the first current source 61.

The emitter follower 51 includes a transistor 51a and a current source 51b connected in series between the power supply Vcc (18) and the ground. The transistor 51a in the base thereof receives the output Vout at the node A, while, the transistor 51 outputs a signal in the emitter thereof to the detector 50.

The detector 50 may detect an average of the output Vout to generate the gain control signal Vagc. The gain control signal Vagc thus generated in the detector 50, as described above, is provided to the base of the second and third transistors, 31 and 41. Specifically, the detector 50 includes an integrator 52 including a resistor 52a and a capacitor 52b, which generates an average of the output Vout. The integrator 52 receives the output of the emitter follower 51, while, the integrator 52 outputs the averaged signal to the comparator 53. The comparator 53 may compare thus generated average of the output Vout with a reference, and transfers a difference between the average and the reference to the second and third transistors, 31 and 41.

In a case where the output Vout increases the level thereof, the detect enhances the gain control signal Vagc, which increases the current flowing in the second and third transistors, 31 and 41, and resultantly the current flowing in the first and fourth transistors, 21 and 42, decreases. The integrator 52 of present embodiment has the resistor 52a of resistance 20 kΩ, and the capacitor 52b of capacitance 0.1 µF, where the cut-off frequency of the integrator 52 becomes about 80 Hz far smaller than the fundamental frequency of the optical signal. Thus, the detector 50 may detect the average, or the DC component of the output Vout.

The operation of the pre-amplifier 13 having the arrangements above described will be described in two extreme cases, where the second transistor 31 in the current shunt 30 turns on and turns off.

When the second transistor 31 turn on, namely, the average of the output Vout is insufficient to turn the second and third transistors, 31 and 41, on; the operating of the pre-amplifier 13 becomes substantially equal to those of a conventional common base circuit. Specifically, the current flowing in the first transistor 21 and the load resistor 22 becomes a current subtracted by the photocurrent Iin from the current of the current source Ibias1, $I_{c1}$=Ibias1−Iin. Accordingly, the variation of the photocurrent Iin is directly reflected in the change of the current $I_{c1}$ flowing in the load resistor 22 and the change of the output Vout.

When the average of the output Vout becomes greater than the reference, the gain control signal Vagc may turn the transistor 31 on. Moreover, the gain control signal Vagc may increase the current $I_{C2}$ flowing in the second transistor 31 as the average of the output Vout increases. The first and second transistors, 21 and 31, operate as the common base circuit; then, two currents, $I_{C1}$ and $I_{C2}$, have the phase thereof common to each other. Accordingly, the magnitude of respective collector currents, $I_{C1}$ and $I_{C2}$, are proportionally divided from the differential current, Ibias1−Iin, by respective base levels, Vbias and Vagc. That is, the variation of the input photocurrent Iin is not fully reflected in the collector current $I_{C1}$, but only a portion thereof the variation may be appeared in the collector current $I_{C1}$ and the output Vout, which means that the current gain of the common base circuit 20 decreases compared with the case where the second transistor 31 turns off. Although the gain control signal Vagc is generated based on the average of the output Vout, in other words, the DC component of the output Vout; the current gain of the common base circuit 20 in high frequencies is also reduced because the second transistor 31 has the operating point similar to that of the first transistor 21.

When a portion of the difference current Ibias1−Iin is shunt by the current shunt 30, the voltage drop at the load resistor 22 decreases, which enhances the collector level, namely, the average of the output Vout of the first transistor 21. The pre-amplifier 13 of the present embodiment may provide the current supplement 40 to suppress the increase of the average level of the output Vout.

Specifically, the base 41 of the third transistor 41 receives the gain control signal Vagc same with the second transistor 31. Moreover, the current source 63 in the current supplement 40 generates the current Ibias2 substantially equal to the current of the first current source 61, then, the transistor 41 may flow the current substantially equal to the current flowing in the second transistor 31. Because the collector of the third transistor 41 is commonly connected to the node A, then the current, flowing in the transistor 41 flows also in the load resistor 22. Accordingly, the current supplement 40 may compensate the current flowing in the load resistor 22, which is decreased by the current flowing in the second transistor 31; the variation of the average level of the output Vout depending on the change of the average of the input photocurrent Iin may be effectively suppressed. Moreover, the fourth transistor connected in parallel to the third transistor 41, and the fourth transistor 42 receives the fixed bias Vbias same as the first transistor 21, the operating conditions of the third transistor 41 may be equal to the conditions of the second transistor 31.

Figure 4:
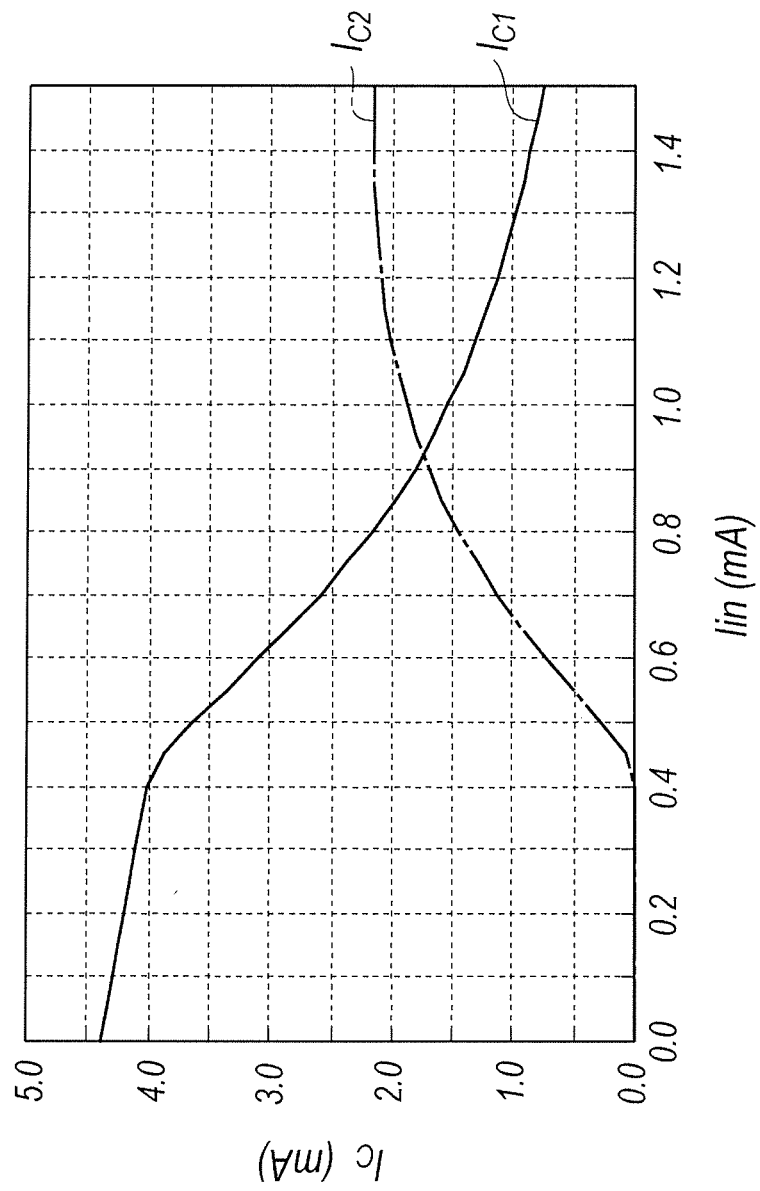
FIG. 4 shows variation of the collector currents flowing in the first and second transistors, respectively.

FIG. 4 shows variation of the collector currents, $I_{C1}$ and $I_{C2}$, of respective transistors, 21 and 31. The solid line corresponds to the collector current $I_{C1}$ of the first transistor 21, while, the chain line corresponds to the collector current $I_{C2}$ of the second transistor 31. When the photocurrent Iin exceeds a value of 0.4 mA, the second transistor 31 in the current shunt 30 begins to flow the collector current $I_{C2}$, and the decrease of the collector current $I_{C1}$ in the common base circuit becomes precipitous.

When the photocurrent varies between 0 and 1 mA, the collector current $I_{c1}$ of the first transistor 21 varies between 4.4 and 1.6 mA, while, the other collector current $I_{c2}$ of the second transistor 31 varies between substantially 0 and 1.8 mA.

Figure 5:
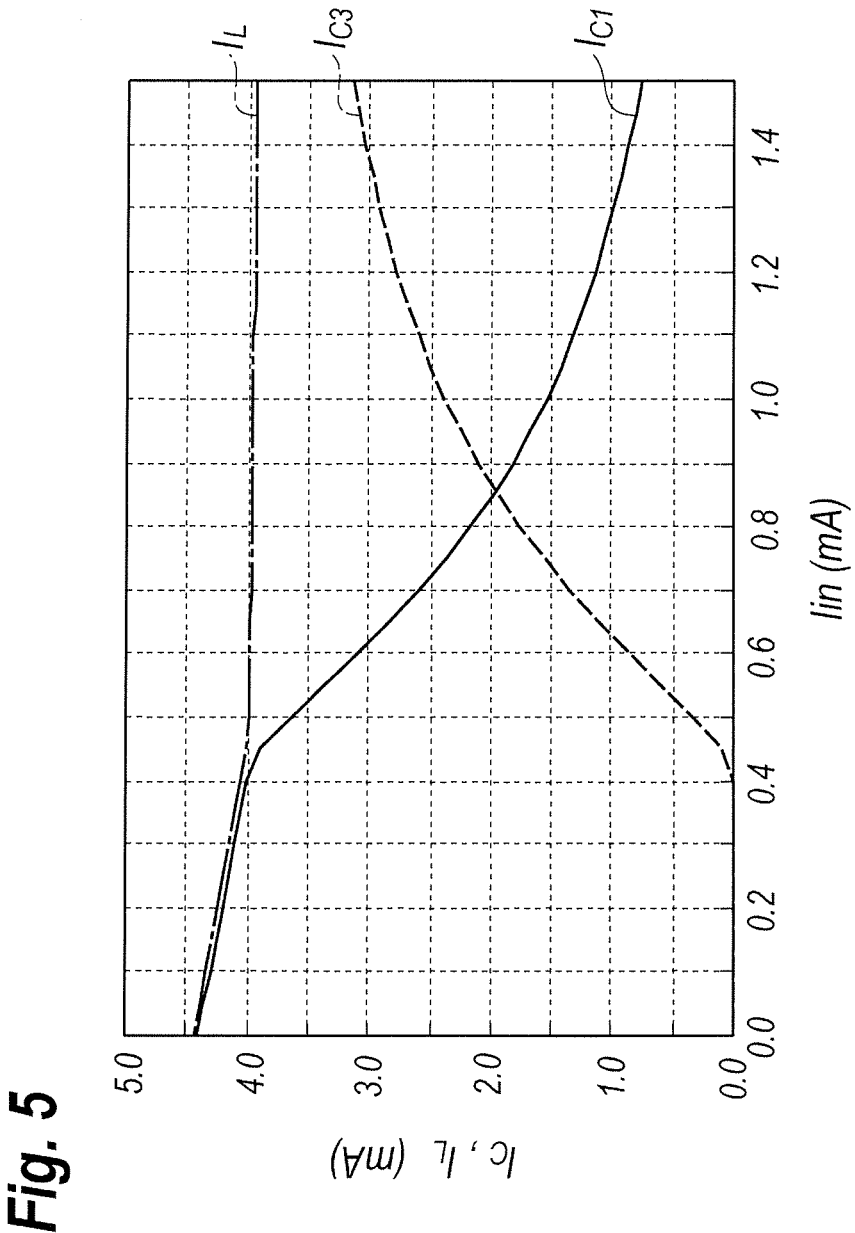
FIG. 5 shows the variation of the collector current of the first transistor in the common base circuit, that of the third transistor in the current shunt, and the current flowing in the road resistor.

FIG. 5 shows the variation of the collector current $I_{C1}$ of the first transistor 21, that $I_{C3}$ of the third transistor 41, and the current $I_L$ flowing in the road resistor 22. The third collector current $I_{C3}$ flowing in the third transistor 41 in the current supplement 40 behaves as those of the collector current $I_{C2}$ of the second transistor 31 in the current shunt 30; but the current $I_L$ flowing in the load resistor 22 shows substantially no change because the third transistor 41 in the current supplement 40 may compensate the decrease of the current shunt by the current shunt 30.

Figure 6:
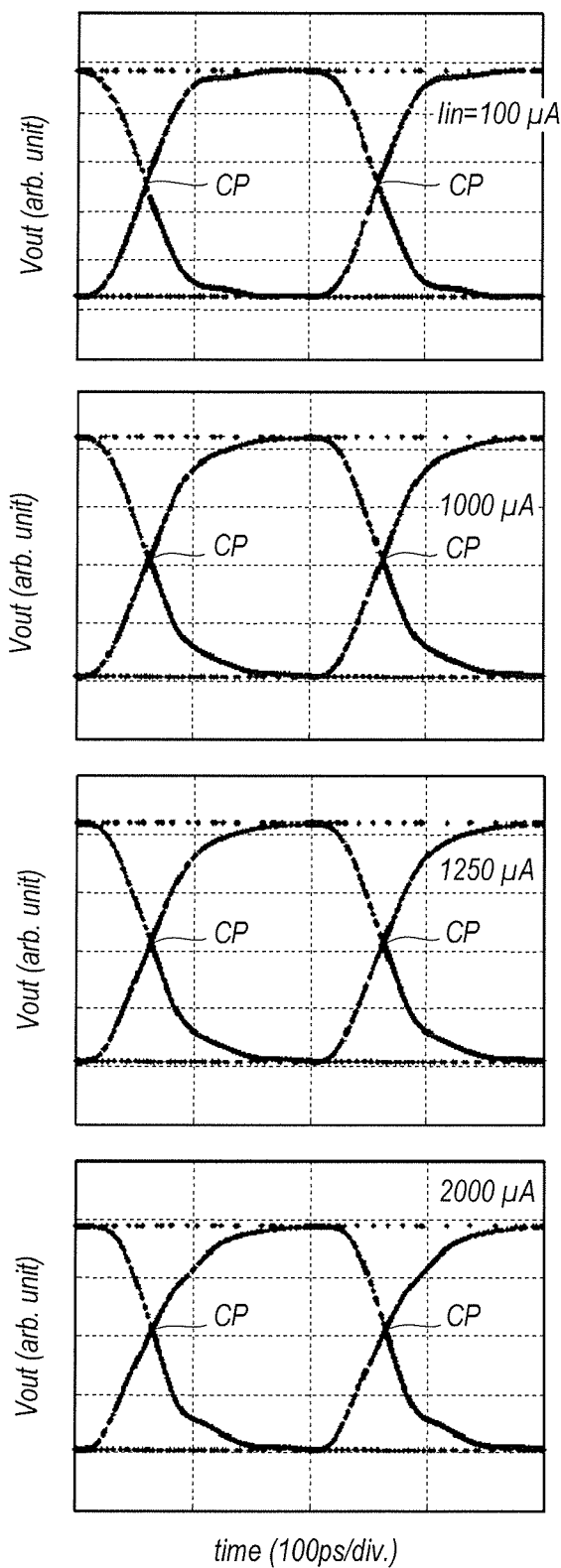
FIG. 6 shows eye diagrams of the output of the pre-amplifier according to the embodiment of the preset invention as varying the input photocurrent Iin from 100 μA to 2000 μA.

FIG. 6 shows eye diagrams of the output Vout of the pre-amplifier 13 according to the embodiment of the preset invention as varying the input photocurrent Iin from 100 µA to 2000 µA. As shown in those eye diagrams in FIG. 6, even when the magnitude of the photocurrent Iin increases, the cross point CP of the eye diagram does not shift toward a higher level side and stays substantially in constant at around 50%. Thus, the preamplifier 13 with the common base input 20, the current shunt 30, and the current supplement 40 may effectively suppress the distortion appeared in the output Vout thereof.

Figure 7:
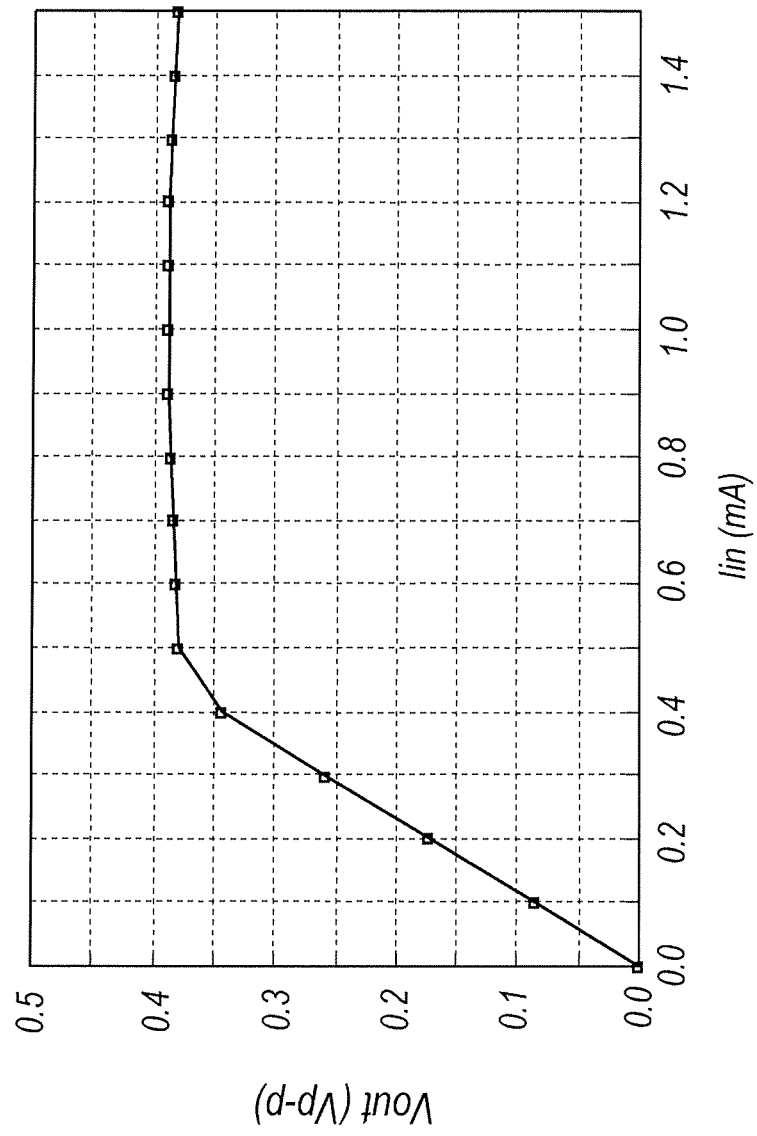
FIG. 7 shows the amplitude of the output of the pre-amplifier in a peak-to-peak unit as varying the input photocurrent.
Figure 8:
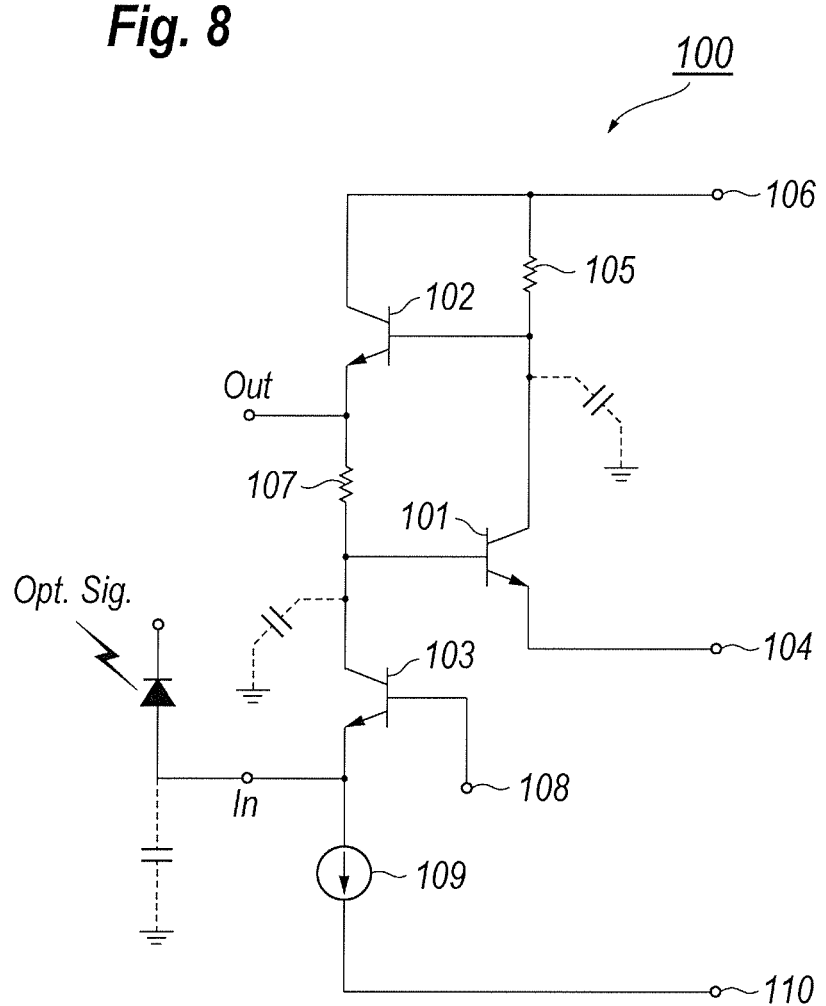
FIG. 8 shows a fundamental portion of the common base circuit disclosed in a prior art.
Figure 9:
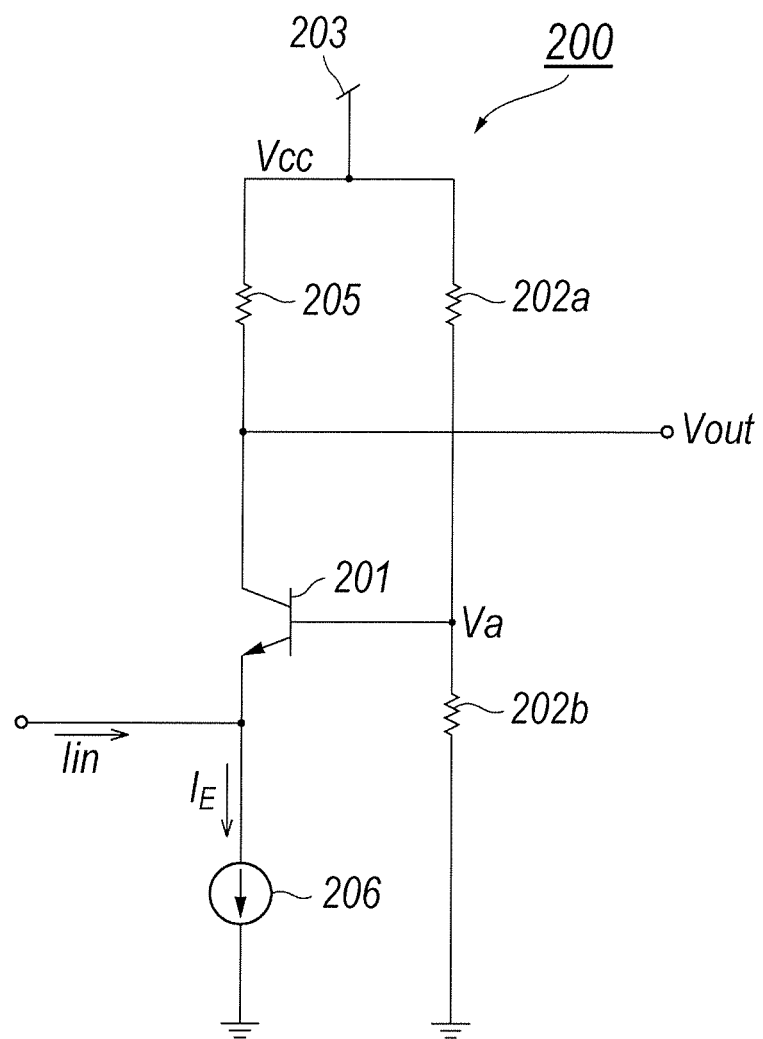
FIG. 9 that shows a fundamental circuit of a conventional common base circuit.
Figure 10:
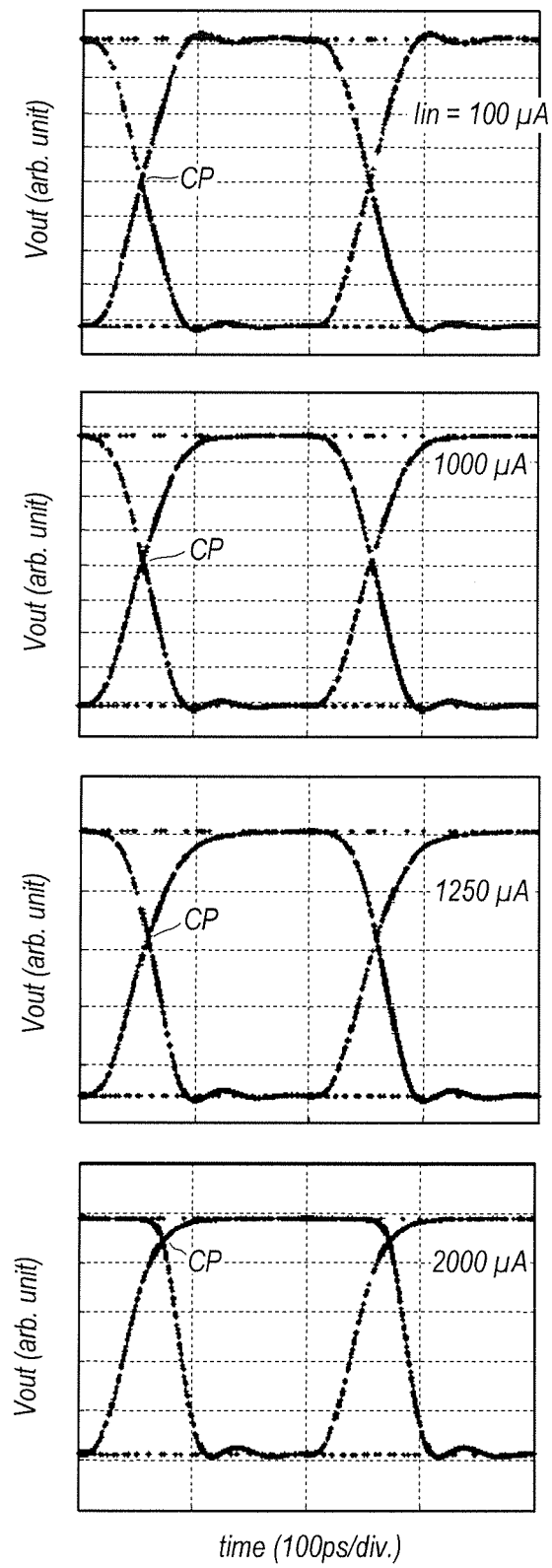
FIG. 10 shows eye diagrams of the output Vout of the common base circuit 200 as varying the input current Iin from 100 μA to 2000 μA.

FIG. 7 shows the amplitude of the output Vout in a peak-to-peak unit as varying the input photocurrent Iin. The output amplitude shows a linear dependence on the input photocurrent Iin until about 0.4 mA; but saturates in a region exceeding 0.4 mA. Thus, the pre-amplifier 13 of the present embodiment may effectively suppress the output saturation thereof without shift of the cross point, which may recover the waveform of the input optical signal.

In the foregoing detailed description, the amplifier, the current-to-voltage converter and the optical receiver of the present invention have been described with reference to specific exemplary embodiments thereof. It will, however, be evident that various modifications and changes may be made thereto without departing from the broader spirit and scope of the present invention.

For instance, the embodiments described above concentrate on the active device made of a bipolar transistor; however, the embodiments may replace the bipolar transistor with a field effect transistor (FET). The detector may be not restricted to implement the integrator for detecting the average of the output Vout; other circuits able to decide the average of the output Vout may be applicable. Moreover, the embodiment described above outputs the voltage signal Vout, that is, the amplifier with the common base circuit operates as the current-to-voltage converter; however, the amplifier may have the configuration of the current amplifier to output the collector current of the first transistor. Thus, the present specification and figures are accordingly to be regarded as illustrative rather than restrictive.

What is claimed is:

1. An amplifier comprising:
a common base circuit including a first transistor operating in a common base arrangement, the first transistor receiving an input current in an emitter thereof and generating a first current flowing therein;
a current shunt for shunting a second current from the first current depending on an average of an output of the amplifier, the current shunt including a second transistor operating in the common base arrangement to flow the second current therein, the second transistor being driven by the average of the output of the amplifier; and
a current supplement for supplying a third current to the first current, the current supplement including a third transistor driven by the average of the output of the amplifier,
wherein the third current is substantially equal to the second current shunt by the current shunt.

2. The amplifier of claim 1,
further comprising a resistor operated as a load of the first transistor,
wherein the first current and the third current flow in the resistor together to generate the output of the amplifier as a voltage signal.

3. The amplifier of claim 2,
further including a constant current source commonly connected to an emitter of the first transistor and an emitter of the second transistor,
wherein the first current flowing in the first transistor is determined by a subtraction of the input current and the second current from a current determined by the constant current source.

4. The amplifier of claim 1,
wherein the current supplement further includes a fourth transistor and another current source, the third transistor and the fourth transistor constituting a differential circuit combined with the another current source,
wherein the fourth transistor is commonly biased with the first transistor, and the second transistor is commonly biased with the third transistor by the average of the output of the amplifier.

5. A current-to-voltage converter, comprising:
a common base circuit including a first transistor operating in a common base arrangement, the first transistor receiving an input current in an emitter thereof and generating a first current flowing therein;
a current shunt for shunting a second current from the first current depending on an average of an output of the current-to-voltage converter, the current shunt including a second transistor operated in the common base arrangement to flow the second current therein;
a current supplement for supplying a third current to the first current, the current supplement including a third transistor to flow the third current therein; and
a detector for detecting the average of an output of the common base circuit,
wherein the detector drives the second transistor and the third transistor by the average of the output common base circuit, and
wherein the second current shut by the current shut is substantially equal to the third current supplied from the current supplement.

6. The current-to-voltage converter of claim 5,
further comprising a resistor operated as a load of the first transistor,
wherein the first current and the third current flow in the resistor together to generate the output of the common base circuit as a voltage signal.

7. The current-to-voltage converter, of claim 5,
further including a constant current source commonly connected to an emitter of the first transistor and an emitter of the second transistor,
wherein the first current flowing in the first transistor is determined by a subtraction of the input current and the second current from a current determined by the constant current source.

8. The current-to-voltage converter of claim 5,
wherein the current supplement further includes a fourth transistor and another current source, the third transistor and the fourth transistor constituting a differential circuit combined with the another current source,
wherein the fourth transistor is commonly biased with the first transistor, and the second transistor is commonly biased with the third transistor by the average of an output of the detector.

9. An optical receiver for receiving an optical signal generated by a photodiode and outputting an output signal corresponding to the optical signal, the optical receiver comprising:
a pre-amplifier for converting a photocurrent generated by the photodiode into a voltage signal, the pre-amplifier including,
a common base circuit including a first transistor operating in a common base arrangement, the first transistor receiving the photocurrent in an emitter thereof and generating a first current flowing therein,
a current shunt for shunting a second current from the first current depending on an average of the voltage signal output from the pre-amplifier, the current shunt including a second transistor operating the common base arrangement, the second transistor flowing the second current therein;
a current supplement for supplying a third current to the first current, the current supplement including a third transistor to flow the third current therein, and
a detector for detecting the average of the voltage signal and driving the second transistor and the third transistor;
a plurality of differential amplifiers provided in downstream of the pre-amplifier; and
an offset compensator for compensating an output offset of the optical receiver,
wherein the third current is substantially equal to the second current shunt by the current shunt.

10. The optical receiver of claim 9,
further comprising a resistor operated as a load of the first transistor,
wherein the first current and the third current flow in the resistor together to generate the voltage signal.

11. The amplifier of claim 9,
further including a constant current source commonly connected to an emitter of the first transistor and an emitter of the second transistor,
wherein the first current flowing in the first transistor is determined by a subtraction of the photocurrent and the second current from a current a the constant current source.

12. The amplifier of claim 9,
wherein the current supplement further includes a fourth transistor and another current source, the third transistor and the fourth transistor constituting a differential circuit combined with the another current source,
wherein the fourth transistor is commonly biased with the first transistor, and
wherein the second transistor is commonly biased with the third transistor by the average of the voltage signal output from the pre-amplifier.

* * * * *